United States Patent [19]

Reher et al.

[11] Patent Number: 5,215,834
[45] Date of Patent: Jun. 1, 1993

[54] BATTERY THERMAL CONTROL SYSTEM AND METHOD

[75] Inventors: Michael T. Reher, Milwaukee; Bradley N. Koeppel, Watertown, both of Wis.

[73] Assignee: Globe Union Inc., Milwaukee, Wis.

[21] Appl. No.: 837,861

[22] Filed: Feb. 18, 1992

[51] Int. Cl.⁵ .......................... H01M 10/50
[52] U.S. Cl. ..................... 429/62; 429/61; 429/120
[58] Field of Search .............. 424/61, 62, 120; 429/23

[56] References Cited

U.S. PATENT DOCUMENTS 4,468,440 8/1984 Evjen .................... 429/120
5,141,826 8/1992 Bohm et al. ............ 429/120

Primary Examiner—Olik Chaudhuri
Assistant Examiner—C. Everhart
Attorney, Agent, or Firm—Foley & Lardner

[57] ABSTRACT

A battery thermal control system and method is provided which selectively heats or cools a storage battery in accordance with the battery temperature and state of charge. The thermal control system includes a battery housing having an internal airspace between the battery and the housing which extends between two openings in the battery housing, a reversible fan configured to generate an airstream along the airspace, a temperature sensor mounted to detect the temperature of the battery, and a control circuit for monitoring battery temperature and voltage and for controlling the operation of the fan. Battery state of charge is approximated by measuring battery voltage and monitored to prevent excessive battery discharge by the thermal control system. When the battery voltage exceeds a predetermined voltage and the battery temperature is outside of a predetermined range of suitable operating and storage temperatures, the thermal control system operates the fan to heat or cool the battery, as needed.

29 Claims, 4 Drawing Sheets

BATTERY THERMAL CONTROL SYSTEM AND METHOD

FIELD OF THE INVENTION

This invention relates to a system and method for controlling the temperature of a battery and, more particularly, to a system and method for selectively heating or cooling a rechargeable storage battery to thereby extend the life of the battery.

BACKGROUND OF THE INVENTION

Rechargeable storage batteries are used in a wide variety of applications. Lead-acid batteries are one such type of rechargeable storage battery and are commonly used in automobiles, other vehicles, and in numerous back-up power systems. As such, these batteries experience a broad range of operating and storage temperatures. In northern U.S. climates, ambient temperatures often fall well below −10° C. and in southern U.S. climates, ambient temperatures may exceed 50° C.

Two other factors influence automobile battery temperature. Because automotive batteries are typically located in the automobile engine compartment, they are exposed to engine heat. When engine cooling is at a minimum, such as during city stop and go driving or while the engine is idling, heat generated by the engine may elevate the underhood air temperature above 100° C. Moreover, the heat generated within the battery during use further elevates the battery temperature. Recent trends in vehicle design have resulted in even greater underhood temperatures. This is due to hotter engine designs built to improve engine efficiency and due to automobile downsizing, improvements in automobile aerodynamics, and an increased number of underhood components which restrict underhood air flow.

These battery, temperature extremes are of concern to automobile and battery manufacturers because the storage capability and usable life of these batteries is largely dependent upon battery temperature. At colder temperatures, the ability of lead-acid batteries to deliver current is decreased. Furthermore, the average running state-of-charge is typically lower at colder temperatures, due to decreased charge acceptance rates and the increased loads placed on the automotive charging systems. As a result, lead-acid batteries provide relatively poor cold starting performance, especially when the battery is used multiple times to restart the engine within a short period of time. At higher temperatures, the battery grids are subject to accelerated corrosion and battery water loss due to electrolysis caused by an excessive voltage and, in some instances, evaporation of the water from the acid. Such corrosion may create a protective layer on the battery grids, thereby reducing the amount of exposed plate material available for storing energy. Additionally, boiling and electrolysis of the battery acid loosens and separates plate material from the battery grids, thereby reducing battery storage capacity.

By controlling battery temperature within desirable limits, useable battery life can be more than doubled in some instances. It would therefore be useful to have a battery thermal control system that maintains battery temperature to within desirable limits. However, such a system preferably has several features. First, the system should be capable of both heating or cooling the battery, as necessary. Secondly, the system should operate independent of vehicle operation. This is especially true where the automotive battery is subject to engine heat, since the engine acts as a large thermal mass which can maintain the underhood temperature at an elevated level up to several hours after the engine is turned off. Thirdly, the system should exhibit very little power drain and should be sensitive to battery state of charge. The system should prevent discharging the battery beyond the point where the benefit of additional temperature adjustment is less than the deficit of a deeper discharge. Deep discharging of batteries is another contributor to decreased battery life.

Although many systems for changing battery temperature have been developed, none provide all the above-mentioned features required for proper battery thermal protection. For instance, U.S. Pat. Nos. 2,104,769, 2,104,773, 3,977,490, 4,976,327, and 5,015,545 disclose various methods for cooling an automobile battery. None of the apparatuses disclosed in these patents provide adequate thermal protection, because, among other things, they are not able to heat the battery to a temperature which provides a satisfactory battery charge acceptance. U.S. Pat. Nos. 2,717,045, 4,840,855, and 5,031,712 each disclose systems for selectively heating or cooling the automobile battery. Although some of these systems provide for heating or cooling of the battery when the engine is not running, none of these systems are, among other things, sensitive to battery state of charge to prevent undesirable discharging of the battery.

SUMMARY OF THE INVENTION

The present invention provides a battery thermal control system which is responsive to battery temperature and state of charge to selectively heat or cool the battery, as needed. The invention includes a battery housing having first and second openings and an air flow path extending between the openings when the battery is placed in the housing, air flow means such as a fan for directing the air along the air flow path, sensor means for detecting the battery temperature, and control means responsive to the sensor means and the battery voltage for selectively operating the air flow means in accordance with the battery temperature detected by the sensor means and in response to the battery voltage. The system senses battery voltage to estimate battery state of charge. The operation of the air flow means is enabled only when battery voltage exceeds a predetermined voltage to prevent the system from discharging the battery below a predetermined state of charge.

The control means can be configured to operate the air flow means when voltage exceeds a first predetermined level and then continue to operate until the voltage falls below a second, lower predetermined voltage. Hysteresis is thereby introduced which prevents the controller from cycling on and off about a voltage set point. Similarly, the maximum and minimum temperature set points can each be separated into a control means on and off threshold so that, for instance, the system begins cooling the battery at one temperature and continues to cool the battery until it falls below a second, lower temperature.

In another embodiment, the system provides both heating and cooling by utilizing a reversible fan disposed to provide heated air into the first opening or unheated air into the second opening. Additionally, conduits can be used to route heated and unheated air to the battery openings.

The present invention further provides a method for changing the temperature of a battery which includes the steps of sensing the voltage and temperature of the battery and generating an airstream of unheated air that impinges upon the battery when the temperature of the battery is above a predetermined maximum temperature and the voltage of the battery is above a predetermined voltage.

BRIEF DESCRIPTION OF THE DRAWINGS

A preferred exemplary embodiment of the present invention will hereinafter be described in conjunction with the appended drawings, wherein like numerals denote like elements, and wherein.

DESCRIPTION OF THE PREFERRED EMBODIMENTS

Figure 1:
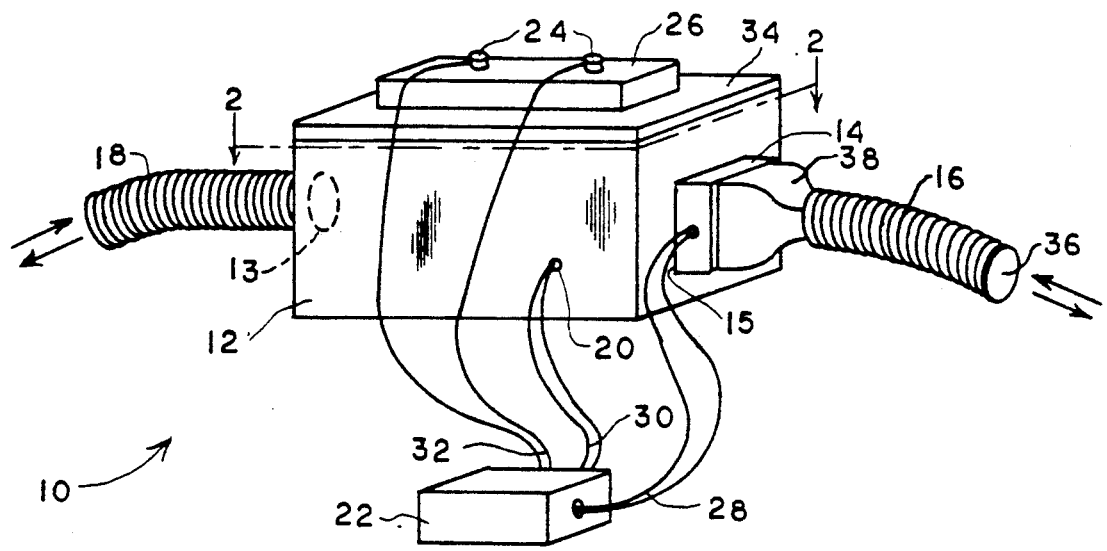
FIG. 1 is a perspective view of a thermal control system arranged in accordance with one embodiment of the present invention.
Figure 2:
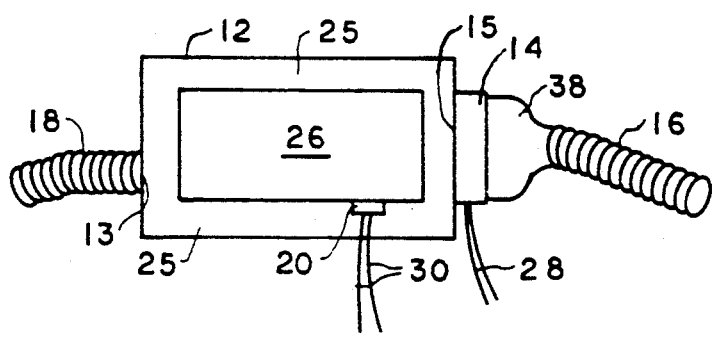
FIG. 2 is a cross-sectional view taken along lines 2—2 of FIG. 1.

As shown in FIGS. 1 and 2, the thermal control system of the present invention, designated generally as 10, includes a battery housing 12 having openings 13 and 15 in opposite sides thereof for transmitting air to and from housing 12, a fan 14 attached to opening 15 of housing 12, a conduit 16 attached to fan 14 and a conduit 18 attached to opening 13 to transmit air to and from housing 12, a temperature sensor 20, and a control circuit 22 connected to fan 14, sensor 20, and the terminals 24 of a battery 26. Fan 14, sensor 20, and terminals 24 are connected to control circuit 22 via pairs of wires 28, 30, and 32, respectively. Control circuit 22 monitors the voltage of battery 26 via wires 32 and the temperature of battery 26 via sensor 20. When the voltage of battery 26 exceeds a predetermined maximum and the temperature of battery 26 falls outside of a predetermined range, control circuit 22 operates fan 14 in either a forward or reverse mode to control the temperature of battery 26. In its forward mode, fan 14 operates to force air from conduit 16, into housing 12, and out through conduit 18. In its reversed mode, fan 14 operates to draw air through conduit 18, into housing 12, and out through conduit 16.

Battery housing 12 may suitably be any housing configured to hold battery 26 and adapted to have an airspace 25 between the first and second openings 13 and 15 when battery 26 is placed in housing 12. For instance, housing 12 can be configured either to enclose only a portion of battery 26 (as shown in FIG. 1) or to completely enclose battery 26. If housing 12 is configured to enclose only a portion of battery 26, a top portion 34 can be used to provide a generally air tight seal between housing 12 and battery 26. However, as will be understood by those skilled in the art, no airtight seal is needed and, in the broader aspects of the invention, housing 12 is not required so long as fan 14 is configured to generate an airstream that impinges upon battery 26 in a manner sufficient to alter the temperature of battery 26. If used, housing 12 can be made from any of a variety of either insulating or non-insulating materials. Preferably, battery 26 is configured in housing 12 such that the airspace 25 established between the first and second openings 13 and 15 of housing 12 covers a substantial portion of battery 26. To accomplish this, the length and width of housing 12 can be made larger than the corresponding length and width of battery 26 and may include pads (not shown) on the bottom of housing 12, to thereby allow air to flow around and underneath battery 26. Alternatively, the first and second openings 13 and 15 can be located in a common side of housing 12 and housing 12 can be configured to have an internal barrier located between the first and second openings and extending between battery 26 and the common side of housing 12, to thereby establish an airspace that extends substantially around the perimeter of battery 26. Other configurations of housing 12 will be apparent to those skilled in the art.

Preferably, fan 14 is mounted on housing 12 to provide air flow into or out of either the first or second opening in housing 12. Fan 14 can be located anywhere along the airflow path defined by housing 12, adapter 38 conduit 16, and conduit 18. For instance, fan 14 Alternatively, fan 14 could be located within housing 12. Furthermore, other means for providing an air flow into housing 12 can suitably be employed. For example, thermal control system 10 can be configured such that air flows through housing 12, except as limited by an electrically, pneumatically, or mechanically controlled damper or air valve that is responsive to control circuit 22.

Preferably, conduits 16 and 18 are employed to provide housing 12 with heated and unheated air. To that end, conduit 16 may be routed to a location proximate the engine exhaust manifold to provide housing 12 with a source of heated air and conduit 18 may be routed underneath the front bumper of the automobile to provide housing 12 with a source of unheated air. It will be understood by those skilled in the art that conduits 16 and 18 are needed only if the first and second openings 13 and 15 of housing 12 cannot be located proximate a source of heated or unheated air, as desired. If conduits 16 and 18 are not employed, then the airflow path utilized by thermal control system 10 is simply the airspace 25 existing between the first and second openings 13 and 15 of housing 12 when battery 26 is placed therein. As shown in FIG. 1, an adapter 38 may be employed to interface conduit 16 and/or conduit 18 to fan 14 and/or housing 12, as will be appreciated by those skilled in the art.

Sensor 20 can be any means for detecting the temperature of battery 26. Preferably, sensor 20 is thermally coupled to battery 26 and can be mounted on housing 12, within housing 12, on battery 26, within battery 26 as shown, or at any other location suitable for detecting a temperature representative of the temperature of battery 26. Alternatively, sensor 20 could comprise an apparatus for estimating battery temperature, such as that disclosed in U.S. Pat. No. 5,079,716, and entitled "Method and Apparatus for Estimating a Battery Temperature," which is hereby incorporated by reference.

One feature of the present invention is its ability to change battery temperature during periods when the automobile engine is not running. However, battery 26 is only recharged when the engine is operating. To prevent excessive battery discharge, control circuit 22 is therefore configured to operate fan 14 only if the voltage of battery 26 is above a predetermined voltage. Since battery voltage while discharging roughly approximates battery state of charge, configuring control circuit 22 in this way permits thermal control system 10 to operate fan 14 only when battery 26 is at a high state of charge. Moreover, battery 26 will only have an elevated voltage for a period of time beginning when the engine is running and there is excess alternator capacity until sometime after the engine is turned off, depending upon the amount of battery loads that exist once the engine has been turned off. Thus, by choosing an appropriate first predetermined threshold voltage V1, thermal control system 10 can be designed to operate fan 14 during the period of time that battery 26 typically requires the most cooling, i.e., during engine operation and for a period of time after the engine has been turned off, during which the underhood temperature remains elevated. It should be noted that the actual voltages used for the first threshold voltage V1 and second threshold voltage V2, to be referred to hereinafter, are highly battery and application specific, as will be appreciated by those skilled in the art.

Control circuit 22 is responsive to battery voltage and temperature (as measured by sensor 20) to control the operation of fan 14. More particularly, control circuit 22 is configured to operate fan 14 in either a forward or reverse mode to heat or cool, respectively, battery 26 when the voltage of battery 26 ($V_{bat}$) is above the first predetermined voltage (V1) and the temperature of battery 26 ($T_{bat}$) is outside predetermined limits (T1, T2) which define a range of desirable battery storage and operating temperatures. Preferably, control circuit 22 is configured to include both a voltage and temperature hysteresis characteristic. This can be accomplished as follows. Control circuit 22 operates fan 14 when $V_{bat}$ is above V1 and $T_{bat}$ is outside of the range of temperatures defined by minimum temperature T1 and maximum temperature T2. Control circuit 22 thereafter continues to operate fan 14 until either $V_{bat}$ falls below the second and lower predetermined voltage (V2) or $T_{bat}$ falls between a second, predetermined minimum temperature (T3) and a second, predetermined maximum temperature (T4), both of which fall within the T1, T2 temperature range. Introducing hysteresis in this manner prevents thermal control system 10 from cycling about the temperature and voltage set points.

Figure 3:
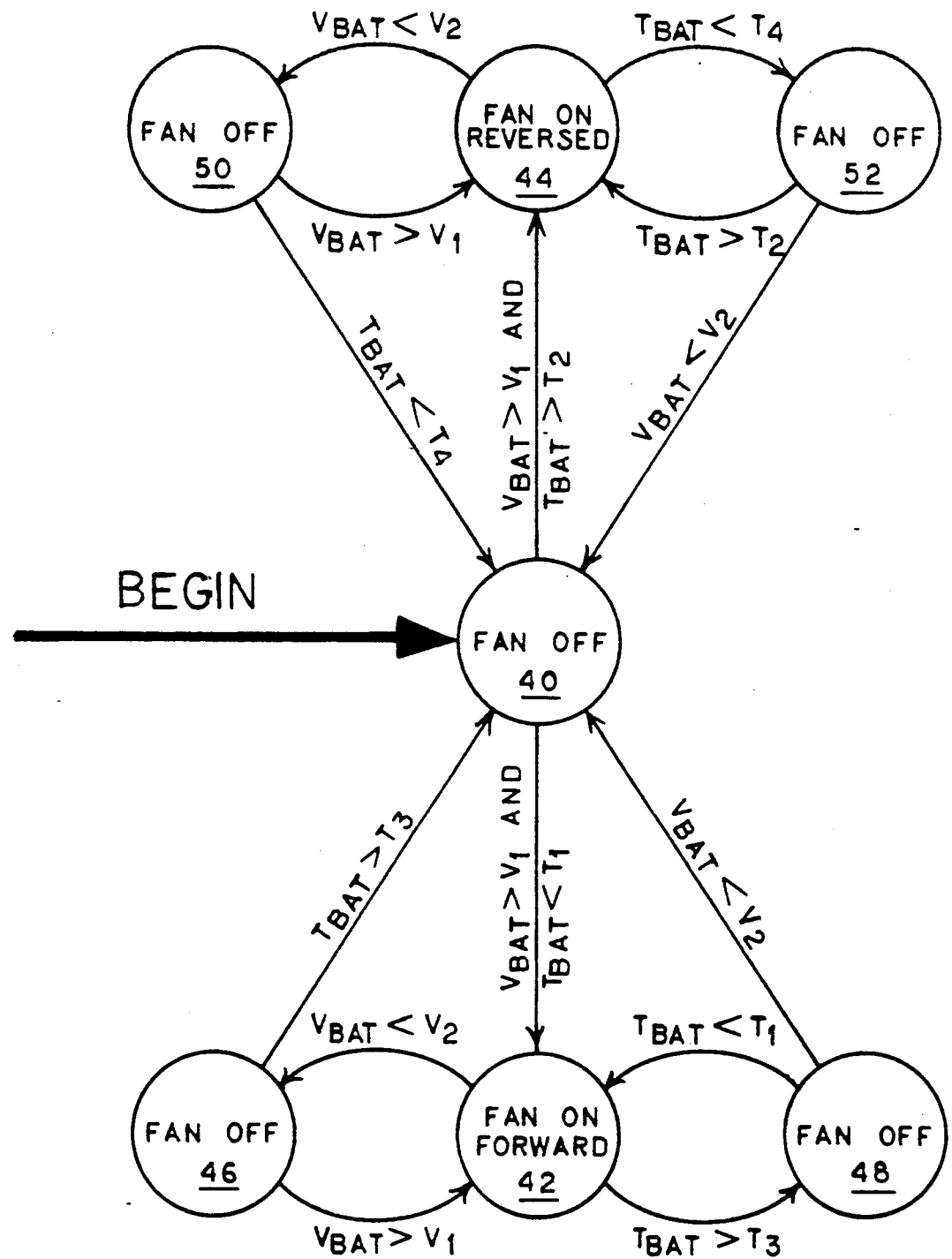
FIG. 3 is a state diagram depicting possible operating states of the system of the present invention.

Referring now to FIG. 3, it depicts a state diagram for the function of control circuit 22. Without hysteresis, there are only three possible states, denoted by reference numerals 40, 42, and 44. Thermal control system 10 will be in what can be considered an initial state 40 whenever either $V_{bat}$ is less than V1 or $T_{bat}$ is within the predetermined limits (i.e., T1<$T_{bat}$<T2). Therefore, if $V_{bat}$ exceeds V1 and $T_{bat}$ falls below T1, thermal control system 10 drives fan 14 in the forward mode to heat battery 26, as indicated at state 42. If, however, $V_{bat}$ exceeds V1 and $T_{bat}$ rises above T2, thermal control system 10 drives fan 14 in the reverse mode to cool battery 26, as indicated at state 44. Thus, thermal control system 10 will merely switch between states 40 and 42 and states 40 and 44, depending upon battery voltage and temperature.

By introducing voltage and temperature hysteresis, four more states are defined in which fan 14 is off, but from which the forward and reverse operating states (42 and 44, respectively) can be entered under different conditions than are required when entering those states from initial state 40. Thermal control system 10 either remains in state 40 or moves into forward mode (state 42) or reverse mode (state 44). Once in state 42, thermal control system 10 will remain there as long as $V_{bat}$ is greater than the second, lower predetermined voltage V2 and $T_{bat}$ is less than the second, predetermined minimum temperature T3. If $V_{bat}$ falls below V2, thermal control system 10 enters a state 46. It will remain in state 46 until either $V_{bat}$ exceeds V1, for which it will return to state 42, or $T_{bat}$ exceeds T3, for which it will return to initial state 40. Once in state 42, if $T_{bat}$ exceeds T3, thermal control system 10 will move to a state 48, where it will remain until either $T_{bat}$ falls below T1, for which it will return to state 42, or $V_{bat}$ falls below V2, for which it will return to initial state 40.

Operation of thermal control system 10 is similar when the temperature of battery 26 is near the upper end of the T1, T2 temperature range. Specifically, when $V_{bat}$ is greater than V1 and $T_{bat}$ is greater than T2, thermal control system 10 will move from initial state 40 to state 44, in which fan 14 is operating in the reverse mode to cool battery 26. From there, thermal control system 10 will move into a state 50 if $V_{bat}$ falls below V2 or will move into a state 52 if $T_{bat}$ falls below the second, predetermined maximum temperature T4. Once in state 50, thermal control system 10 will return to initial state 40 if $T_{bat}$ falls below T4 or will return to state 44 if $V_{bat}$ returns above V1. From state 52, thermal control system 10 will return to initial state 40 if $V_{bat}$ falls below V2 or will return to state 44 if $T_{bat}$ exceeds T2.

By way of example, and not as a limitation, typical values for the predetermined voltages and predetermined temperatures are as follows:

V1 = 13.0 Volts
V2 = 12.7 Volts
T1 = 10.0° Celsius
T2 = 40.0° Celsius
T3 = 20.0° Celsius
T4 = 35.0° Celsius These predetermined values represent the preferred values for a lead-acid wet cell battery selectively heated or cooled with a reversible 60 mA fan within an automotive application. The selection of the predetermined values is entirely battery, application, and air-flow device dependent and determining the preferred values will be known by those skilled in the art.

Figure 4:
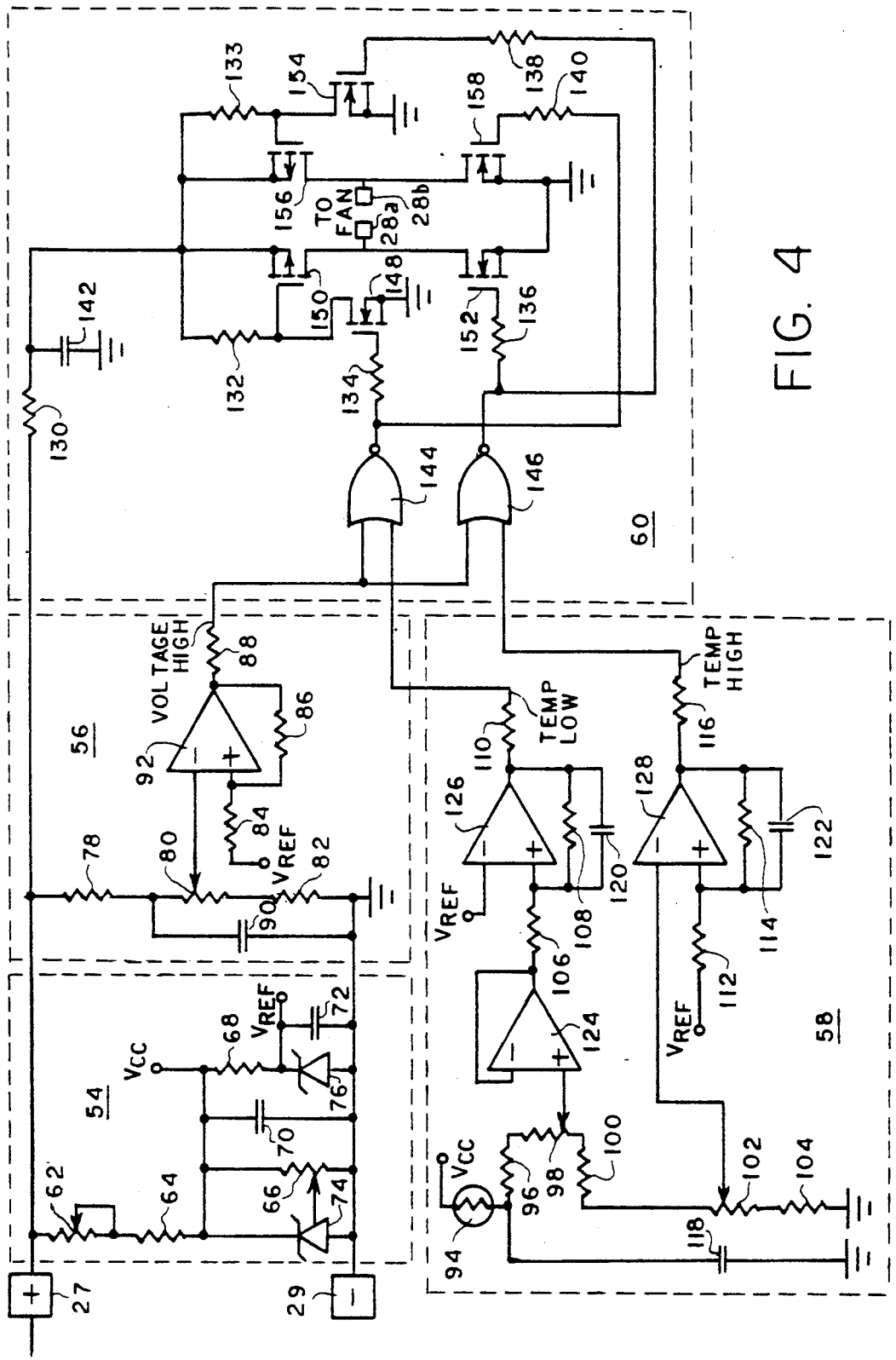
FIG. 4 contains a schematic representation of a control circuit which may be suitably employed in a thermal control system embodying the present invention.

A circuit suitable for providing the functions performed by control circuit 22 is depicted in FIG. 4. Control circuit 22 includes a power supply 54, a voltage sensing circuit 56, a temperature sensing circuit 58, and a fan controller 60. Power supply 54 uses the power available from battery 26 to generate supply and reference voltages for the components of control circuit 22. Voltage sensing circuit 56 generates a logic signal indicative of $V_{bat}$ which includes the voltage hysteresis characteristic. Temperature sensing circuit 58 generates a pair of logic signals indicative of whether $T_{bat}$ is less than T1, greater than T2, or between T1 and T2 and which includes the temperature hysteresis characteristic. Fan controller 60 is responsive to the logic signals provided by voltage sensing circuit 56 and temperature sensing circuit 58 to operate fan 14 accordingly.

Power supply 54 includes resistors 62, 64, 66, and 68, capacitors 70 and 72, and voltage references 74 and 76. Resistor 62 is a variable resistor connected between the positive terminal 27 of battery 26 and one end of resistor 64. The other end of resistor 64 is connected to a node denoted VCC. Voltage reference 74 is a three terminal regulator having its cathode connected to VCC, its anode connected to the negative terminal 29 of battery 26, which is used throughout the control circuit 22 as a common ground, and its output control pin connected to the wiper arm of variable resistor 66. One end of resistor 66 is connected to VCC and the other end is connected to ground. Resistor 68 is connected between VCC and a node denoted VREF. Capacitor 70 is connected between VCC and ground. Capacitor 72 is connected between VREF and ground. Voltage reference 76 is a two terminal voltage reference having its cathode connected to VREF and its anode connected to ground.

Voltage sensing circuit 56 includes resistors 78, 80, 82, 84, 86, and 88, capacitor 90, and operational amplifier 92. Resistor 78 is connected between the positive terminal 27 of battery 26 and a first end of resistor 80 and capacitor 90. The second end of capacitor 90 is connected to ground. Resistor 82 is connected between the second end of resistor 80 and ground. Resistor 80 is a three terminal variable resistor having its wiper arm connected to the inverting input of op-amp 92. Resistor 84 is connected between VREF and the non-inverting input of op-amp 92. Resistor 86 is connected between the output and non-inverting input of op-amp 92. Resistor 88 is connected between the output of op-amp 92 and a node denoted VOLTAGE HIGH.

Temperature sensing circuit 58 includes thermistor 94, resistors 96, 98, 100, 102, 104, 106, 108, 110, 112, 114, and 116, capacitors 118, 120, 122, and operational amplifiers 124, 126, and 128. The resistance of thermistor 94 is strongly temperature dependent and is used in thermal control system 10 as temperature sensor 20. Thermistor 94 is connected between VCC and one end of resistor 96 and capacitor 118. The other end of capacitor 118 is connected to ground. Resistor 98 is a three terminal variable resistor connected between the other end of resistor 96 and one end of resistor 100. The wiper arm of resistor 98 is connected to the non-inverting input of op-amp 124. Resistor 102 is a three terminal variable resistor connected between the other end of resistor 100 and one end of resistor 104. The wiper arm of resistor 102 is connected to the inverting input of op-amp 128 The other end of resistor 104 is connected to ground. The output of op-amp 124 is connected to its inverting input and one end of resistor 106. The other end of resistor 106 is connected to the non-inverting input of op-amp 126 and one end of resistor 108 and capacitor 120. The other end of resistor 108 is connected to the other end of capacitor 120 and to the output of op-amp 126. The inverting input of op-amp 126 is connected to VREF. Resistor 110 is connected between the output of op-amp 126 and a node denoted TEMP LOW. Resistor 112 is connected between VREF and the non-inverting input of op-amp 128. Resistor 114 and capacitor 122 are connected between the output and non-inverting input of op-amp 128. Resistor 116 is connected between the output of op-amp 128 and a node denoted TEMP HIGH.

Fan controller 60 includes resistors 130, 132, 133, 134, 136, 138, and 140, capacitor 142, NOR gates 144 and 146, and transistors 148, 150, 152, 154, 156, and 158. Resistor 130 is connected between the positive terminal 27 of battery 26 and one end of resistor 132, one end of capacitor 142, one end of resistor 133, and the source of transistors 150 and 156. The other end of capacitor 142 is connected to ground. The other end of resistor 132 is connected to the drain of transistor 148 and the gate of transistor 150. The other end of resistor 133 is connected to the drain of transistor 154 and the gate of transistor 156. The drain of transistor 150 is connected to the drain of transistor 152 and a first power lead 28a of fan 14. The source of transistors 148 and 152 are connected to ground. The drain of transistor 156 is connected to the drain of transistor 158 and to a second power lead 28b of fan 14. The source of transistors 154 and 158 are connected to ground. NOR gates 144 and 146 are two-input NOR gates, each having one input connected to VOLTAGE HIGH. The other input of NOR gate 144 is connected to TEMP LOW. The other input of NOR gate 146 is connected to TEMP HIGH. The output of NOR gate 144 is connected to one end of resistors 134 and 140. The other end of resistor 134 is connected to the gate of transistor 148. The other end of resistor 140 is connected to the gate of transistor 158. The output of NOR gate 146 is connected to one end of resistors 136 and 138. The other end of resistor 136 is connected to the gate of transistor 152. The other end of resistor 138 is connected to the gate of transistor 154.

Voltage reference 74 can comprise an LM336-5.0 and voltage reference 76 can comprise an LM385-1.2, both manufactured by National Semiconductor. Thermistor 94 can be a 100K thermistor, as manufactured by Keystone Carbon Co. Op-amps 92, 124, 126, and 128 may each suitably comprise one-fourth of an TLC27L4, manufactured by Texas Instruments. NOR gates 144 and 146 may each be one-quarter of an MC14001UB, manufactured by Motorola. Transistors 148, 152, 154, and 158 can each be an IRFD110, manufactured by International Rectifier. Transistors 150 and 156 can each be an IRFD9110, manufactured by International Rectifier. By way of example, and not as a limitation, the following tables list preferred values for the resistors and capacitors of control circuit 22 when control circuit 22 is used for automotive applications.

| Resistor | Value | Resistor | Value | Resistor | Value |
|---|---|---|---|---|---|
| 62 | 20 K | 88 | 10 K | 112 | 27 K |
| 64 | 1 K | 96 | 27 K | 114 | 909 K |
| 66 | 100 K | 98 | 20 K | 116 | 10 K |
| 68 | 1.3 K | 100 | 10 K | 130 | 3.6 Ω |
| 78 | 1.24 M | 102 | 20 K | 132 | 10 K |
| 80 | 20 K | 104 | 24 K | 134 | 220 Ω |
| 82 | 121 K | 106 | 100 K | 136 | 220 Ω |
| 84 | 5.1 K | 108 | 909 K | 138 | 220 Ω |
| 86 | 2.2 M | 110 | 10 K | 140 | 220 Ω |
| Capacitor | Value | | | | |
| 70 | .1 μF | | | | |
| 72 | .1 μF | | | | |
| 90 | 1.0 μF | | | | |
| 118 | 1.0 μF | | | | |
| 120 | .01 μF | | | | |
| 122 | .01 μF | | | | |
| 142 | 1.0 μF | | | | |

Power supply 54 is used to derive the regulated supply voltage (VCC) and the reference voltage (VREF). VCC is used to power various active components used in control circuit 22 and to derive voltages indicative of $T_{bat}$. VREF is used to provide the voltage and temperature set points (V1, V2, and T1-T4).

Voltage sensing circuit 56 is responsive to $V_{bat}$ to generate VOLTAGE HIGH. VOLTAGE HIGH is active low, i.e., it is a logical 0 whenever $V_{bat}$ exceeds the predetermined minimum voltage V1. As shown in FIG. 4, voltage hysteresis is introduced into voltage sensing circuit 56 using resistors 84 and 86. In this configuration, VOLTAGE HIGH is a logical 0 when $V_{bat} > V1$ and thereafter remains a logical 0 until $V_{bat} < V2$, after which $V_{bat}$ must exceed V1 for VOLTAGE HIGH to again become a logical 0. The amount of hysteresis is determined by the relative values of resistors 84 and 86. Where no hysteresis is desired, resistor 86 can be connected to ground rather than the output of op-amp 92, as will be appreciated by those skilled in the art.

The operation of voltage sensing circuit 56 is as follows. The inverting input of op-amp 92 receives a voltage indicative of $V_{bat}$. The voltage at the non-inverting input of op-amp 92 is set by resistors 84 and 86 such that when the output of op-amp 92 is at its maximum voltage, the inputs to op-amp 92 will be equal when $V_{bat}$ equals V1. When $V_{bat} > V1$, the output of op-amp 92 will go to its lowest value, which corresponds to a logical 0. When the output of op-amp 92 is at this lowest voltage, the voltage at the non-inverting input of op-amp 92 will be less than when the output of op-amp 92 is at its maximum value. Thus, once the output of op-amp 92 falls to its lowest voltage, $V_{bat}$ must fall below a voltage somewhat lower than V1 (i.e., V2) before the output of op-amp 92 will be driven to its maximum value. Op-amp 92 therefore operates as a comparator with hysteresis.

Temperature sensing circuit 58 operates in a manner similar to voltage sensing circuit 56 to determine when $T_{bat}$ is outside of the range of temperatures defined by T1 and T2. As can be seen in FIG. 4, temperature sensing circuit 58 has two channels, one each for determining when $T_{bat}$ crosses the temperature range limits T1 and T2. The upper channel, which utilizes op-amps 124 and 126, corresponds to the lower limit T1 of the temperature range and the lower channel, which utilizes op-amp 128, corresponds to the upper limit T2 of the temperature range. Thermistor 94 is thermally coupled to battery 26 and has a negative temperature co-efficient such that the voltages provided to op-amps 124 and 128 by the voltage divider defined by thermistor 94 and resistors 96, 98, 100, 102, and 104 have a positive temperature co-efficient.

The operation of the lower channel of temperature sensing circuit 58 (which corresponds to T2), is the same as that of voltage sensing circuit 56. Op-amp 128 generates TEMP HIGH, which is a logical 0 whenever $T_{bat} > T2$. By connecting resistor 114 to the output of op-amp 128 rather than ground, temperature hysteresis about the upper limit T2 can be introduced in the same way that voltage hysteresis is introduced in voltage sensing circuit 56. The operation of the upper channel of temperature sensing circuit 58 (which corresponds to T1) is similar. However, the inputs to op-amp 126 are reversed such that its output will be a logical 1, rather than a logical 0, when $T_{bat} > T1$. These connections are reversed because the upper channel signals fan controller 60 to operate fan 14 to heat battery 26 when $T_{bat}$ falls below T1, rather than when it exceeds some value, as is done for $V_{bat}$ in voltage sensing circuit 56 and for the upper temperature limit T2 in the lower channel. Op-amp 124 operates as a unity gain amplifier of the voltage appearing on the wiper arm of variable resistor 98. As in the lower channel, resistors 106 and 108 provide the hysteresis characteristic about the lower temperature limit T1.

Fan controller 60 is responsive to VOLTAGE HIGH, TEMP LOW, and TEMP HIGH provided by voltage sensing circuit 56 and temperature sensing circuit 58 to selectively operate fan 14 in either the forward or reverse mode. More particularly, NOR gate 144 and transistors 148, 150, and 158 are responsive to VOLTAGE HIGH and TEMP LOW to operate fan 14 in the forward mode. NOR gate 146 and transistors 152, 154, and 156 are responsive to VOLTAGE HIGH and TEMP HIGH to operate fan 14 in the reverse mode. Transistors 148, 150, and 158 are switched on when the output of NOR gate 144 is at a high logic level. This output will only be a logical 1 when VOLTAGE HIGH is a logical 0 (i.e., $V_{bat} > V1$) and TEMP LOW is a logical 0 (i.e., $T_{bat} < T1$). Similarly, NOR gate 146 turns on transistors 152, 154 and 156 to operate fan 14 in the reverse mode when $V_{bat} > V1$ and $T_{bat} > T2$. The outputs of NOR gates 144 and 146 will never both be a logical 1 since T1 < T2. Additionally, as previously discussed, the voltage and temperature hysteresis introduced by voltage sensing circuit 56 and temperature sensing circuit 58, respectively, provides the four additional states 46, 48, 50, and 52 shown in FIG. 3 to continue operating fan 14 in either the forward or reverse mode until the voltage hysteresis (V1-V2) or temperature hysteresis (T3-T1 or T2-T4) is overcome. Note that T1 should be less than T4 and T2 should be greater than T3 so that control circuit 22 does not attempt to operate fan 14 simultaneously in both the forward and reverse modes.

Figure 5:
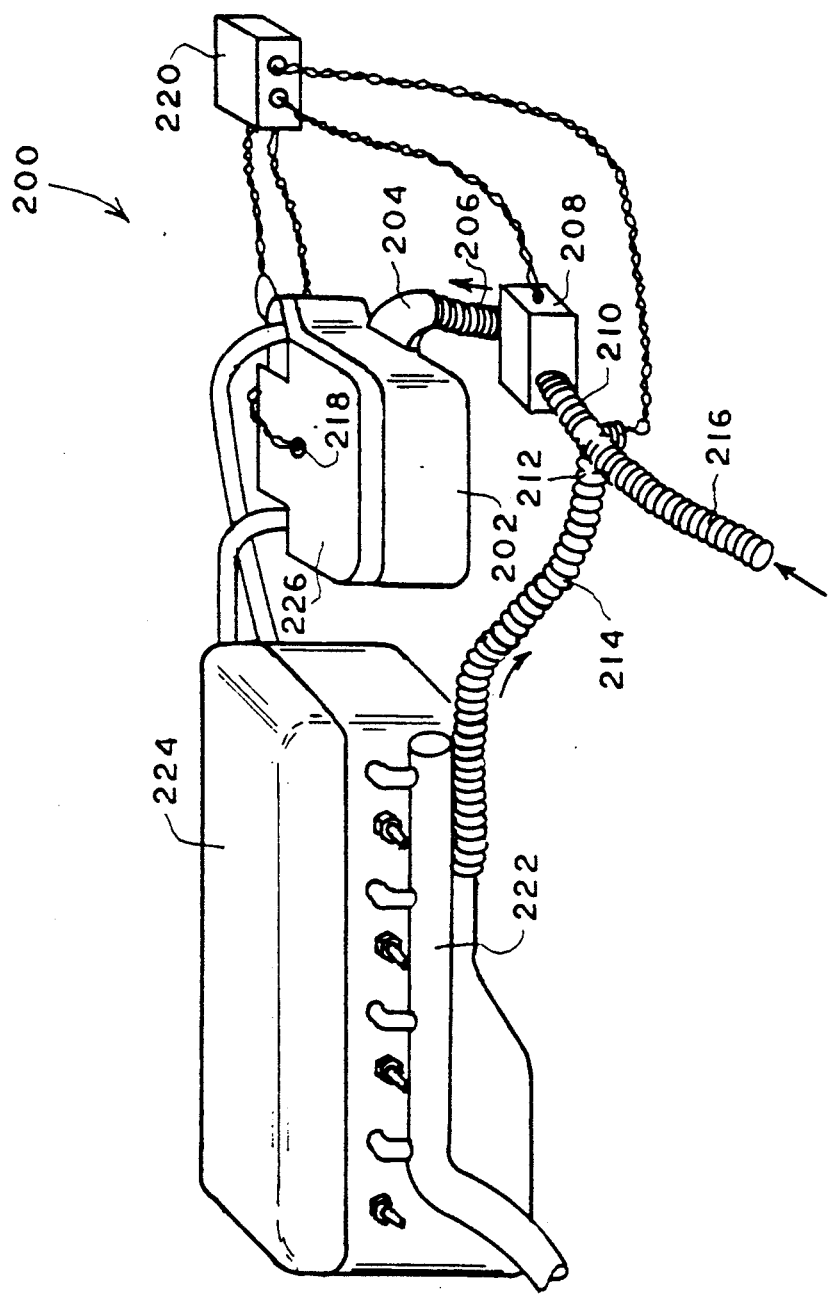
FIG. 5 is a perspective view of a thermal control system embodying the present invention as it might be configured in the engine compartment of an automobile.

Referring now to FIG. 5, it illustrates a second embodiment of the present invention, designated generally as 200, which includes a battery housing 202 having an air inlet 204 connected via a conduit 206 to a fan 208. A second conduit 210 connects fan 208 to the outlet of an air valve 212. Valve 212 has two air inlets, one of which is connected to a third conduit 214 and the other of which is connected to a fourth conduit 216. A temperature sensor 218 is mounted in housing 202 to sense the temperature of an automotive battery placed therein (not shown). Fan 208, valve 212, sensor 218, and the battery are all electrically connected to a control circuit 220.

Control circuit 220 monitors battery voltage and temperature as discussed in connection with the first embodiment. However, rather than reversing the air flow through housing 202 to selectively heat or cool the automotive battery, control circuit 220 operates fan 208 in one direction only and controls air valve 212 to select either heated or unheated air via conduits 214 and 216, respectively. Preferably, conduit 214 is routed such that it intakes heated air proximate an exhaust manifold 222 of an automobile engine 224, as depicted in FIG. 5. Conduit 216 is preferably routed underneath the front bumper (not shown) of the automobile to receive unheated air.

Control circuit 220 can be implemented using the circuitry shown in FIG. 4 for control circuit 22, except that fan controller 60 would be modified to operate fan 208 and valve 212 in accordance with the functions described above. Such modifications will be known by those skilled in the art.

In addition to air intake 204, housing 202 should have an air outlet for permitting air forced into housing 202 via fan 208 to escape. This can be accomplished in various ways, as will be appreciated by those skilled in the art. For instance, housing 202 can include a removable top portion 226 which has openings for access to the terminals of the battery contained within housing 202 and which operate as air outlets. Such a housing is shown and described in U.S. Pat. No. 5,031,712, which is hereby incorporated by reference.

While the preferred embodiment disclosed herein is specifically directed to automotive application, the battery thermal control system and method of the present invention may also be employed equally as effectively in other rechargeable battery applications, as can be recognized by those skilled in the art. One example of such an application is Uninterruptible Power Systems (UPS) where batteries and battery packs are used to power devices when the primary power source fails. These systems are found commonly in the telecommunication, computer, cable/TV, etc. industries. Some of the smaller systems involve one or two batteries being enclosed in a protective container exposed to the environment. During the hot summer days this enclosure can get excessively hot, and the present invention may be employed in conjunction with a fan or damper to cool the batteries within the enclosure. During the colder winter nights, the present invention may be employed in conjunction with a heater or damper to warm the batteries within the enclosure.

Thus, there has been provided in accordance with the present invention a battery thermal control system that fully satisfies the aims and advantages described herein. Although the invention has been described in conjunction with specific embodiments thereof, it is evident that many alternatives, modifications, and variations will be apparent to those skilled in the art. For instance, the functions performed by control circuits 22 and 220 could be carried out in a general purpose computer. Accordingly, it is intended that all such alternatives, modifications, and variations be embraced within the spirit and scope of the appended claims.

We claim:

1. A thermal control system for changing the temperature of a battery, comprising:
    a battery housing configured to hold the battery and having first and second openings, said housing having an air flow path extending between said first and second openings when the battery is placed in said housing, said first opening being disposed to receive air having a temperature sufficient to alter the temperature of the battery when the air is directed along said air flow path;
    air flow means for directing the air along said air flow path;
    sensor means for detecting the battery temperature; and
    control means responsive to said sensor means and the battery voltage for selectively operating said air flow means in accordance with said battery temperature detected by said sensor means and in response to said battery voltage.

2. A thermal control system as defined in claim 1 wherein said first opening is disposed to receive unheated air and said control means operates said air flow means to direct said unheated air into said first opening, along said air flow path, and out through said second opening in response to said battery temperature detected by said sensor means being above a first predetermined maximum temperature and said battery voltage exceeding a first predetermined voltage.

3. A thermal control system as defined in claim 2 wherein said air flow means comprises a fan.

4. A thermal control system as defined in claim 2 wherein said air flow means comprises an air flow damper.

5. A thermal control system as defined in claim 2 wherein said control means terminates the operation of said air flow means in response to said battery voltage being less than a second predetermined voltage or said battery temperature detected by said sensor means being less than a second predetermined maximum temperature.

6. A thermal control system as defined in claim 2 further comprising a first conduit having one end connected to said first opening and the other end positioned to receive said unheated air.

7. A thermal control system as defined in claim 6 further comprising a second conduit having one end connected to said second opening and the other end positioned to discharge the air away from said housing.

8. A thermal control system as defined in claim 1 wherein said first opening is disposed to receive heated air and said control means operates said air flow means to direct said heated air into said first opening, along said air flow path, and out through said second opening in response to said battery temperature detected by said sensor means being below a first predetermined minimum temperature and the voltage of the battery exceeding a first predetermined voltage.

9. A thermal control system as defined in claim 8 wherein said air flow means comprises a fan.

10. A thermal control system as defined in claim 8 wherein said air flow means comprises an air flow damper.

11. A thermal control system as defined in claim 8 wherein said control means terminates the operation of said air flow means in response to said battery voltage being less than a second predetermined voltage or said battery temperature detected by said sensor means being greater than a second predetermined minimum temperature.

12. A thermal control system as defined in claim 8 further comprising a first conduit having one end connected to said first opening and the other end positioned to receive said heated air.

13. A thermal control system as defined in claim 12 further comprising a second conduit having one end connected to said second opening and the other end positioned to discharge the air away from said housing.

14. A thermal control system as defined in claim 1 wherein said first opening is disposed to receive heated air, said second opening is disposed to receive unheated air, and said control means causes said air flow means to operate in a forward mode directing said heated air into said first opening, along said air flow path, and out through said second opening in response to said battery temperature detected by said sensor means being below a first predetermined minimum temperature and said battery voltage exceeding a first predetermined voltage, and wherein said control means causes said air flow means to operate in a reverse mode directing said unheated air into said second opening, along said air flow path, and out through said first opening in response to said battery temperature detected by said sensor means being above a first predetermined maximum temperature and said battery voltage exceeding said first predetermined voltage.

15. A thermal control system as defined in claim 14 wherein said control means terminates said forward mode of said air flow means in response to said battery voltage being less than a second predetermined voltage or said battery temperature detected by said sensor means being greater than a second predetermined minimum temperature, and wherein said control means terminates said reverse mode of said air flow means in response to said battery voltage being less than said second predetermined voltage or said battery temperature detected by said sensor means being less than a second predetermined maximum temperature.

16. A thermal control system as defined in claim 14 wherein said air flow means comprises a reversible fan.

17. A thermal control system as defined in claim 14 wherein said air flow means comprises an air flow damper.

18. A thermal control system as defined in claim 15 further comprising a first conduit having one end connected to said first opening and the other end positioned to receive said heated air.

19. A thermal control system as defined in claim 15 further comprising a second conduit having one end connected to said second opening and the other end positioned to receive said unheated air.

20. A thermal control system as defined in claim 15 wherein said air flow means is disposed proximate said first opening.

21. A thermal control system as defined in claim 15 wherein said air flow means is disposed proximate said second opening.

22. A thermal control system for changing the temperature of an automotive storage battery, comprising:
a battery housing having first and second openings and an air flow path extending between said first and second openings, said air flow path being formed by the battery and said housing when the battery is placed in said housing, said first opening being disposed to receive air having a temperature sufficient to alter the temperature of the battery when the air is forced along said air flow path;
sensor means for detecting the battery temperature;
air flow means for generating an airstream along said air flow path; and
electronic control means for operating said air flow means in accordance with the said battery temperature detected by said sensor means and in response to the battery voltage exceeding a first predetermined voltage.

23. A thermal control system as defined in claim 22 wherein said electronic control means terminates the operation of said air flow means in response to said battery voltage being less than a second predetermined voltage or said battery temperature detected by said sensor means being within a given temperature range.

24. A thermal control system as defined in claim 22 wherein said air flow means comprises a reversible fan and, in response to the said battery voltage exceeding said first predetermined voltage, said electronic control means operates said fan in a forward direction in response to said battery temperature detected by said sensor means being less than a first predetermined minimum temperature and in a reverse direction in response to the said battery temperature detected by said sensor means being greater than a first predetermined maximum temperature.

25. A method of changing the temperature of a battery, comprising the steps of:
sensing the voltage and temperature of the battery; and
generating an airstream of air that impinges upon the battery in accordance with said battery temperature and in response to said battery voltage.

26. The method of claim 25, wherein said air is unheated air and further comprising the step of generating said airstream of said unheated air that impinges upon the battery when the temperature of the battery is above a first predetermined maximum temperature and the voltage of the battery is greater than a first predetermined voltage, to thereby lower the temperature of the battery.

27. The method of claim 26 further comprising the step of maintaining said airstream until the temperature of the battery is below a second predetermined maximum temperature or the voltage of the battery is less than a second predetermined voltage.

28. The method of claim 25 wherein said air is heated air and further comprising the step of generating an airstream of said heated air that impinges upon the battery when the temperature of the battery is below a first predetermined minimum temperature and the voltage of the battery is greater than a first predetermined voltage, to thereby raise the temperature of the battery.

29. The method of claim 28 further comprising the step of maintaining said airstream until the temperature of the battery is above a second predetermined minimum temperature or the voltage of the battery is less than a second predetermined voltage.

* * * * *